(12) United States Patent
Booth, Jr. et al.

(10) Patent No.: US 7,566,629 B2
(45) Date of Patent: Jul. 28, 2009

(54) PATTERNED SILICON-ON-INSULATOR LAYERS AND METHODS FOR FORMING THE SAME

(75) Inventors: Roger Allen Booth, Jr., Rochester, MN (US); Louis Lu-Chen Hsu, Fishkill, NY (US); Jack A. Mandelman, Flat Rock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 11/155,029

(22) Filed: Jun. 16, 2005

(65) Prior Publication Data
US 2006/0286779 A1    Dec. 21, 2006

(51) Int. Cl.
  *H01L 21/76* (2006.01)
(52) U.S. Cl. ............... 438/423; 438/407; 257/E21.563
(58) Field of Classification Search ................ 438/407, 438/423; 257/E21.563
See application file for complete search history.

(56) References Cited

U.S. PATENT DOCUMENTS

| | | | |
|---|---|---|---|
| 5,956,597 A * | 9/1999 | Furukawa et al. .......... 438/405 |
| 6,756,257 B2 | 6/2004 | Davari et al. | |
| 2002/0173114 A1 | 11/2002 | Fogel et al. | |
| 2003/0104658 A1 | 6/2003 | Furukawa et al. | |
| 2004/0224477 A1 * | 11/2004 | Erokhin et al. .............. 438/407 |
| 2006/0231892 A1 * | 10/2006 | Furukawa et al. ........... 257/347 |

OTHER PUBLICATIONS

Yemin Dong, et al, "Patterned buried oxide layers under a single MOSFET to improve the device performance", Institute of Physics Publishing, Semiconductor Science and Technology, published Dec. 23, 2003, pp. 125-128.

N. David Theodore, Marco Racanelli and Tom Wetteroth, "TFSOI With Improved Oxidation Resistance (To Reduce Isolation Induced Stresses and Leakage)", Motorola Technical Developments, Nov. 1996, pp. 158-159.

* cited by examiner

*Primary Examiner*—Bradley K Smith
(74) *Attorney, Agent, or Firm*—Dugan & Dugan PC

(57) ABSTRACT

In an aspect, a method is provided for forming a silicon-on-insulator (SOI) layer. The method includes the steps of (1) providing a silicon substrate; (2) selectively implanting the silicon substrate with oxygen using a low implant energy to form an ultra-thin patterned seed layer; and (3) employing the ultra-thin patterned seed layer to form a patterned SOI layer on the silicon substrate. Numerous other aspects are provided.

12 Claims, 11 Drawing Sheets

PATTERNED SILICON-ON-INSULATOR LAYERS AND METHODS FOR FORMING THE SAME

FIELD OF THE INVENTION

The present invention relates generally to semiconductor device manufacturing, and more particularly to methods of forming a low-stress patterned silicon-on-insulator layer, and semiconductor devices formed thereby.

BACKGROUND

Silicon-on-insulator (SOI) substrates offer higher performance than bulk substrates due to the lower junction capacitances of SOI-based devices and the increased switching speed associated therewith. This performance advantage is enabled by dielectrically isolating active circuits from the bulk substrate (e.g., via a buried oxide layer).

Conventional processing steps, such as oxygen implantation, used to form a patterned silicon-on-insulator (SOI) layer on a bulk substrate may be destructive to the underlying lattice structure of the SOI and the bulk substrate, adversely affecting device performance. Consequently, improved patterned silicon-on-insulator layers and method for forming the same are desired.

SUMMARY OF THE INVENTION

In a first aspect of the invention, a first method is provided for forming a silicon-on-insulator (SOI) layer. The first method includes the steps of (1) providing a silicon substrate; (2) selectively implanting the silicon substrate with oxygen using a low implant energy to form an ultra-thin patterned seed layer; and (3) employing the ultra-thin patterned seed layer to form a patterned SOI layer on the silicon substrate.

In a second aspect of the invention, a second method is provided for forming a silicon-on-insulator (SOI) layer. The second method includes the steps of (1) providing a silicon substrate; (2) selectively recessing a plurality of exposed portions of the top surface of the silicon substrate to form trenches in the silicon substrate; (3) thereafter, implanting the silicon substrate with oxygen; and (4) forming at least one patterned SOI layer.

In a third aspect of the invention, an apparatus is provided. The apparatus is a substrate that includes (1) a bulk silicon substrate; (2) one or more buried oxide regions forming a buried oxide (BOX) layer within at least a portion of the bulk silicon substrate; and (3) one or more silicon-on-insulator (SOI) regions overlying respective BOX regions thereby forming a patterned SOI seed layer overlying the BOX layer. The patterned SOI seed layer is ultra-thin. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides methods of selectively forming regions of semiconductor on insulator on a bulk semiconductor substrate, and provides substrates created thereby. More specifically, the present invention provides methods of selectively forming silicon on insulator (SOI) on a bulk silicon substrate. The present methods may implant oxygen (e.g., ionized atomic or molecular oxygen) into selected regions of a bulk monocrystalline substrate using a low-energy oxygen implant. Such a low-energy implant may reduce damage to the monocrystalline silicon, which is eventually converted to one or more regions of SOI (hereinafter a "target silicon region"), caused by the passage of the ionized oxygen. In one embodiment, an energy of about 20 to about 100 keV may be used to implant oxygen into the bulk substrate (although larger or smaller and/or different energy ranges may be employed).

Further, the present methods may implant oxygen such that the target silicon region is thin compared to the regions formed using conventional methods. For example, in some embodiments, the target silicon region may be about 20 nm to about 100 nm thick (although a larger or smaller and/or different thickness range may be employed). The target silicon region may serve as a seed layer upon which silicon may be epitaxially grown to yield an SOI layer (e.g., one or more SOI regions) of a desired thickness. Through use of a thinner target silicon region, an amount of stress that develops in the target silicon region is reduced and/or eliminated as the oxygen-implanted region forms and expands (e.g., during subsequent processing to form the SOI layer). Absent the present invention, the above-described stress may cause damage such as dislocations in the silicon region or other defects which may degrade electrical characteristics of the substrate and/or subsequently formed devices. Further, in some embodiments, oxide may be deposited onto a surface (e.g., a trench formed on the surface) of the substrate and serve to absorb some of the above-described stress, thereby reducing the amount of stress that develops in the silicon target region. Thus, a high-quality SOI layer may be formed.

Figure 1:
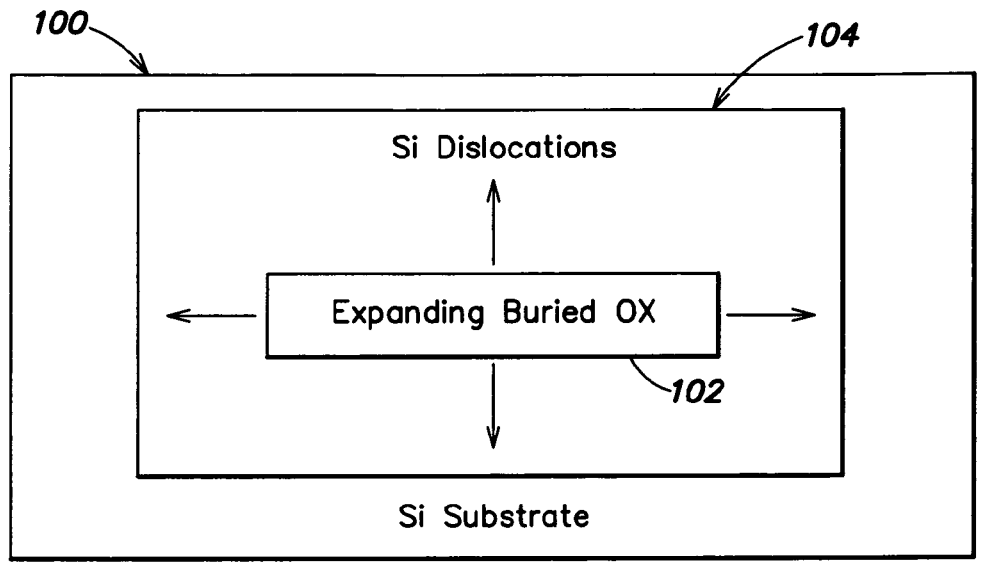
FIG. 1 is a side cross-sectional view of a substrate illustrating effects of implanting oxygen into a bulk substrate to form a silicon-on-oxide (SOI) layer.

FIG. 1 is a side cross-sectional view illustrating effects of implanting oxygen into a bulk substrate to form a silicon-on-oxide (SOI) layer. With reference to FIG. 1, to form an SOI layer (not shown) on a bulk substrate 100, oxygen may be implanted into the bulk substrate 100 (e.g., monocrystalline substrate), to form a buried oxide region 102. During subsequent processing the buried oxide region 102 may expand (e.g., in volume) thereby causing stress to a region 104 of silicon adjacent the buried oxide region 102. The region 104 may include one or more portions of the SOI layer being formed. The stress may cause damage such as dislocations in the silicon region 104 or other defects which may degrade electrical characteristics of the substrate and/or subsequently formed devices. For example, the stress may affect ion mobility and/or cause junction leakage in subsequently formed devices.

The present methods may reduce and/or eliminate the above-described stress. For example, the present methods may implant oxygen into a bulk substrate using low energy. More specifically, some conventional methods may implant oxygen (e.g., $O^+$) using 180 keV of energy, which may result in an oxide layer about 200 nm thick for an implant dose of $5 \times 10^{17}$ $cm^{-2}$ ions and may form an SOI layer about 320 nm thick. In contrast, for a similar ion dose, the present methods may implant oxygen using about 25 keV of energy, which may result in an oxide layer of about 70 nm thick and may form an SOI layer about 30 nm thick. As a further example, the present methods may implant oxygen using about 35 keV to about 70 keV of energy to form an SOI layer about 50 nm thick. By implanting oxygen using low energy, the present methods may reduce a thickness of the SOI layer formed (e.g., compared to conventional methods). Reducing thickness of the SOI layer formed on a substrate reduces silicon stress.

FIGS. 2-8 are side cross-sectional views illustrating a first exemplary method of forming a low-stress patterned SOI layer in accordance with an embodiment of the present invention. FIGS. 9-17 are side cross-sectional views illustrating a second exemplary method of forming a low-stress patterned SOI layer in accordance with an embodiment of the present invention. FIGS. 18-22 are side cross-sectional views illustrating a third exemplary method of forming a low-stress patterned SOI layer in accordance with an embodiment of the present invention.

Figure 2:
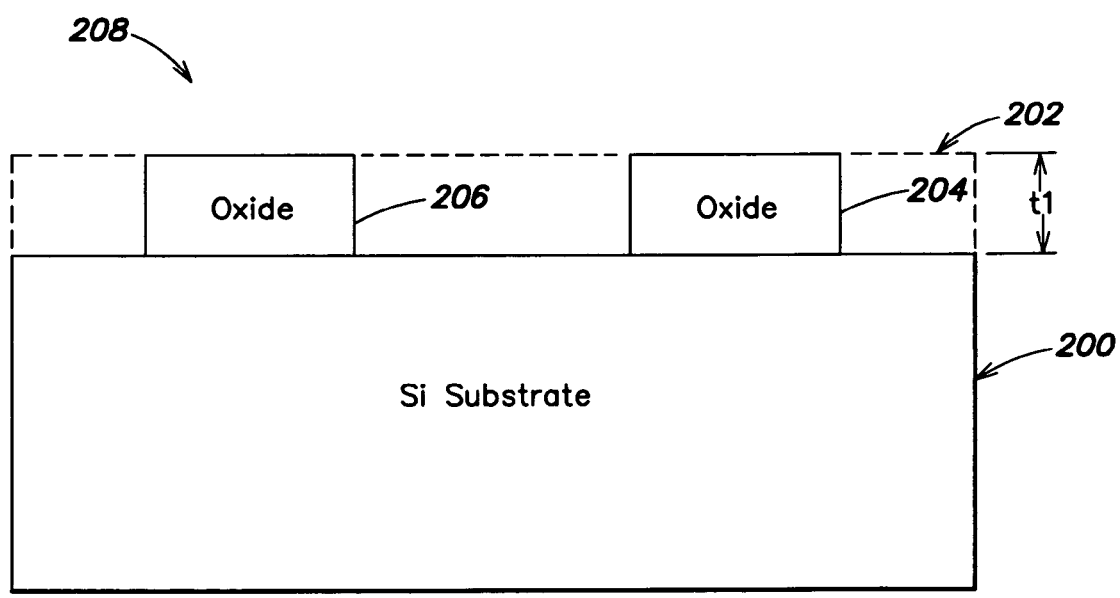
FIG. 2 illustrates a step of a first exemplary method of forming a low-stress patterned SOI layer in which oxide is patterned on a substrate in accordance with an embodiment of the present invention.

FIG. 2 illustrates a step of the first exemplary method of forming a low-stress patterned SOI layer in which oxide is patterned on a substrate in accordance with an embodiment of the present invention. With reference to FIG. 2, in a first embodiment, a silicon substrate (e.g., bulk substrate) 200 is provided. An oxide layer 202 (shown in phantom) may be formed on the substrate 200. The oxide layer 202 may be formed on the substrate using chemical vapor deposition (CVD) or another suitable technique. In one embodiment, the oxide layer 202 may have a thickness t1 of about 100 nm (although a larger or smaller thickness may be employed). Following the formation of the oxide layer 202, the oxide layer 202 may be patterned to form one or more oxide regions 204-206. For example, reactive ion etching (RIE) or another suitable method may be used to etch the oxide layer 202 to form the one or more oxide regions 204-206. After RIE, material (e.g., mask material not separately shown) applied to the substrate 200 during RIE may be removed. In some embodiments, the one or more oxide regions 204-206 may be about 50 nm to about 200 nm thick (although a larger or smaller and/or different thickness range may be employed). The thickness of the SOI layer (e.g., one or more SOI regions) formed by the first exemplary method may be based on the thickness of the one or more oxide regions 204-206.

The one or more oxide regions 204-206 may serve as isolation regions. More specifically, the one or more oxide regions 204-206 may serve to mask portions of the substrate being manufactured 208 where a bulk substrate is desired (e.g., during oxygen implanting). For example, the one or more oxide regions 204-206 may define active and isolated regions of the manufactured substrate 208. In this manner, the relative position of the one or more oxide regions 204-206

(e.g., spaces between adjacent oxide regions 204-206) may define active regions of the substrate (e.g., SOI and bulk silicon) in which one or more semiconductor devices may be formed.

Figure 3:
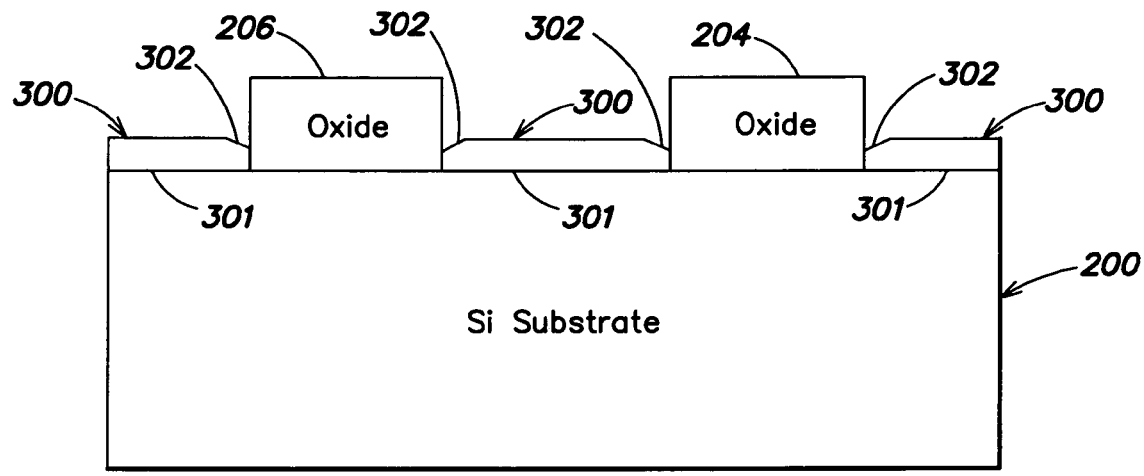
FIG. 3 illustrates a step of the first exemplary method of forming a low-stress patterned SOI layer in which a first epitaxial layer is grown in accordance with an embodiment of the present invention.

FIG. 3 illustrates a step of the first exemplary method of forming a low-stress patterned SOI layer in which a first epitaxial layer is grown in accordance with an embodiment of the present invention. With reference to FIG. 3, a first epitaxial layer 300 (e.g., silicon layer) may be grown on exposed surfaces 301 of the silicon bulk substrate 200. More specifically, the first epitaxial layer may be grown on portions of the bulk substrate 200 that are not masked by the oxide regions 204-206. The first epitaxial layer 300 may be about 20 nm to about 100 nm thick (although a larger or smaller and/or different thickness range may be employed). Corners 302 of the first epitaxial layer 300 adjacent an oxide region 204-206 may be chamfered due to the difference in crystal planes of the oxide region 204-206 and silicon of the first epitaxial layer 300.

Figure 4:
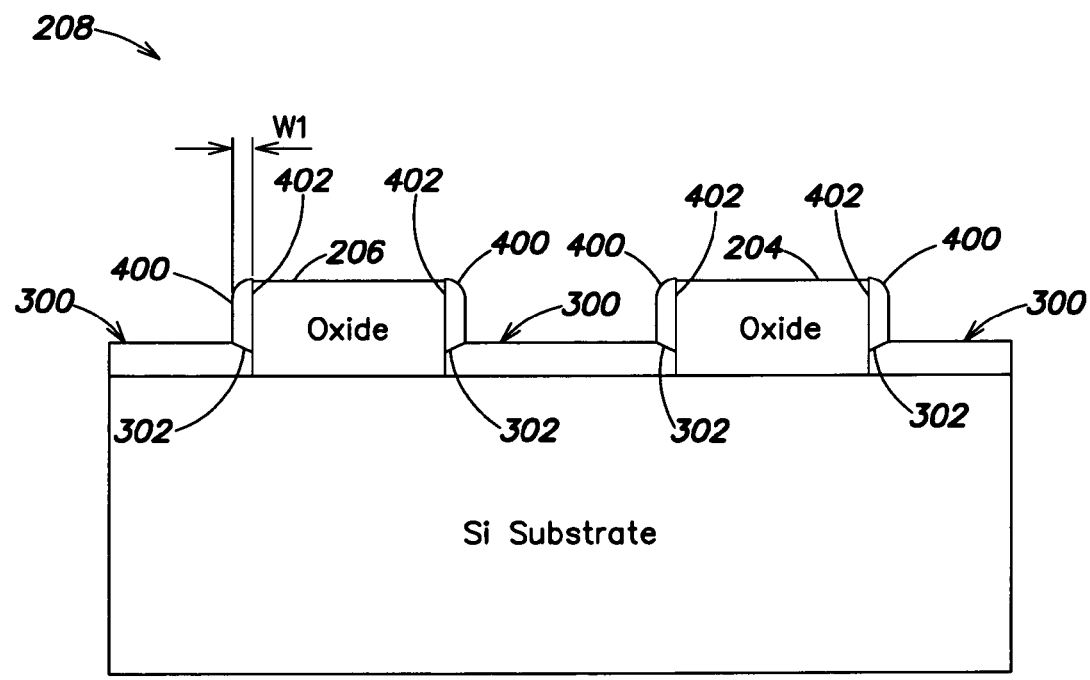
FIG. 4 illustrates a step of the first exemplary method of forming a low-stress patterned SOI layer in which nitride spacers are formed in accordance with an embodiment of the present invention.

FIG. 4 illustrates a step of the first exemplary method of forming a low-stress patterned SOI layer in which nitride spacers are formed in accordance with an embodiment of the present invention. With reference to FIG. 4, nitride spacers 400 may be formed on sidewalls 402 of the one or more oxide regions 204-206. The nitride spacers 400 may be formed by using CVD or another suitable method to deposit a nitride layer (e.g., a conformal layer) on the surface of the substrate 208 being manufactured. Thereafter, RIE or another suitable method may be used to remove (e.g., directionally etch) portions of the deposited nitride layer. The nitride spacers 400 may be formed of a width w1 such that the nitride spacers 400 cover the chamfered corners 302 of the first epitaxial layer 300 (although a larger or smaller width may be employed). For example, in one embodiment, each nitride spacer 400 is about 10 nm to about 100 nm wide (although a larger or smaller and/or different width range may be employed). In this manner, the nitride spacer 400 may prevent contaminants (e.g., residual processing chemicals and by-products of the epi growth reaction) from collecting in seams formed between a chamfered corner 302 of the first epitaxial layer 300 and an oxide region sidewall 402. Additionally, the nitride spacers 400 may prevent deformation of the oxide regions 204-206 due to reflow caused by subsequent processing, such as high-temperature annealing (described below).

Figure 5:
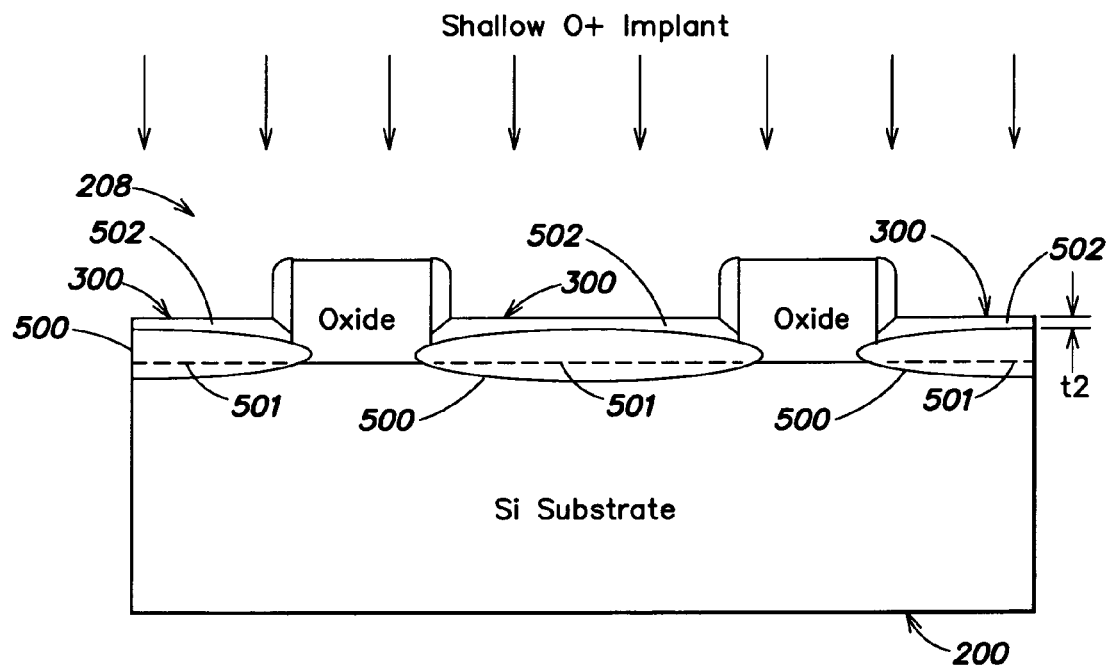
FIG. 5 illustrates a step of the first exemplary method of forming a low-stress patterned SOI layer in which oxygen is implanted into the substrate in accordance with an embodiment of the present invention.

FIG. 5 illustrates a step of the first exemplary method of forming a low-stress patterned SOI layer in which oxygen is implanted into the substrate in accordance with an embodiment of the present invention. With reference to FIG. 5, oxygen (e.g., ionized atomic or molecular oxygen) may be implanted into the substrate 208 to form a buried oxide layer in selected implant regions 500 using low-energy. Energy for implanting oxygen may be selected such that the peak of the implanted oxygen distribution is located approximately at the original silicon bulk substrate surface 501 (shown in phantom). For example, a dose of about $2\times10^{17}$ to about $2\times10^{18}$ cm$^{-2}$ O$^+$ may be implanted using about 20 keV to about 100 keV of energy. Such an energy level may reduce and/or eliminate damage caused to the structure (e.g., lattice) of the silicon in the first epitaxial layer 300 and/or the bulk substrate 200 (e.g., caused by the passage of the oxygen). More specifically, compared to conventional methods, the lower energy employed by the present method to implant oxygen may cause the oxygen to bombard the substrate being manufactured 208 at a slower velocity, and therefore, reduce damage caused to the structure of the silicon in the first epitaxial layer 300 and/or the bulk substrate 200 caused by the passage of the oxygen. Further, employing such a lower energy to implant oxygen may result in shallow selected implant regions 500. Consequently, as described in detail below, remaining portions 502 of the first epitaxial layer 300 overlying the selected implant regions 500 are thin. For example, the remaining portions 502 of the first epitaxial layer 300 may have a thickness t2 of about 5 nm to about 50 nm (although a larger or smaller and/or different thickness range may be employed). It should be noted that the dose range described above preferably is lower than that employed by conventional methods employed to implant oxygen.

In one embodiment, a temperature of about 400° C. to about 700° C. may be employed to implant the oxygen. Such an elevated temperature range may further reduce damage to silicon structure caused by the implanted oxygen and/or increase the solubility of the implanted oxygen into the silicon (e.g., of the first epitaxial layer 300 and/or bulk substrate 200).

The above dose, energy and temperature ranges are exemplary. Therefore, a larger or smaller range and/or different range may be employed for the dose, energy and/or temperature. Further, although in the example above O$^+$ was implanted into the substrate being manufactured 208, in other embodiments, ionized molecular oxygen, such as O$_2^+$, may be implanted. Compared to O$^+$, implanting O$_2^+$ using the same process parameters (e.g., dose, energy and/or temperature range) may result in shallower selected implant regions 500, which eventually form a buried oxide layer.

Figure 6:
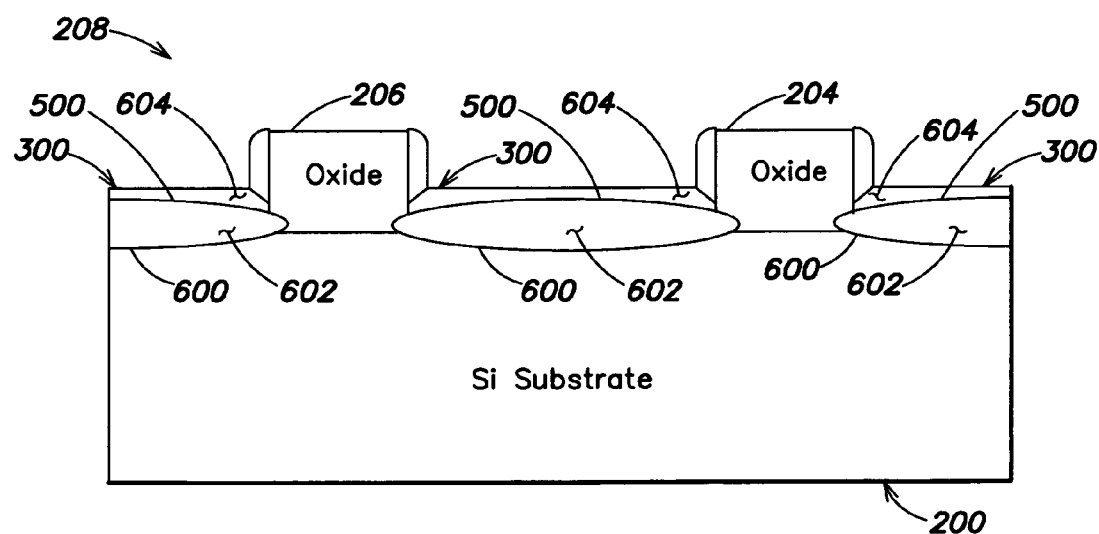
FIG. 6 illustrates a step of the first exemplary method of forming a low-stress patterned SOI layer in which the substrate undergoes annealing in accordance with an embodiment of the present invention.

FIG. 6 illustrates a step of the first exemplary method of forming a low-stress patterned SOI layer in which the substrate undergoes annealing in accordance with an embodiment of the present invention. With reference to FIG. 6, the substrate being manufactured 208 may be subjected to an annealing process in which any structural damage to portions of the first epitaxial layer 300 (e.g., the remaining portions 502) and/or bulk substrate 200 caused while implanting oxygen may be repaired. Further, annealing may form the buried oxide layer 600. It should be noted that the buried oxide layer 600 may be substantially coplanar with an original top surface of the bulk substrate 200. More specifically, before annealing, the selected implant regions (500 in FIG. 5) may include implanted ionized atomic or molecular oxygen. However, annealing causes the oxygen to combine (e.g., chemically) with silicon surrounding the selected implant regions 500. For example, annealing may cause oxygen implanted in the selected implant regions 500 to combine with silicon in portions of the first epitaxial layer 300 and/or the bulk substrate 200 to form silicon dioxide SiO$_2$ regions 602, which serve as an insulator. During this time, the selected implant regions 500 may expand in volume and thin the remaining portions (502 in FIG. 5) of the first epitaxial layer 300 overlying the selected implant regions 500 to form thinner portions 604 of the first epitaxial layer 300. However, because the first remaining portions 502 were thin, structural damage (e.g., dislocations) to silicon in the second thinner portions 604 is reduced and/or minimized. In this manner, the silicon in the portions 604 of the first epitaxial layer 300 may be of a high quality (e.g., include little or no damage). As described below, the thin portions 604 of the first epitaxial layer 300 may serve as seed layers for future epitaxial growth. Further, the oxide regions 204, 206 may serve to absorb stress created by the volume expansion of the selected implant regions 500 during annealing, and thereby, reduce structural damage caused to the portions 604 of the first epitaxial layer 300.

Annealing may be performed using temperatures of about 1100° C. to about 1300° C. (although a larger or smaller and/or different temperature range may be employed). Annealing may be performed, for example, in an inert ambient environment. Alternatively, annealing may be performed in an oxidizing ambient environment such as an internal total oxidation (ITOX) environment. Annealing in such an environment may thicken the selected implant regions (500 in FIG. 5), which eventually form the buried oxide layer, as the buried oxide forms. Consequently, annealing in such an environment may thin the portions 604 of the first epitaxial layer 300 more than annealing using the same temperature range in an inert ambient environment.

In this manner, an insulator 602 (e.g., $SiO_2$) may be formed underneath a thin layer (e.g., the portions 604) of high quality silicon. The portions 604 of the first epitaxial layer 300 may be about 3 nm to about 55 nm thick (although a larger or smaller and/or different thickness range may be employed).

Figure 7:
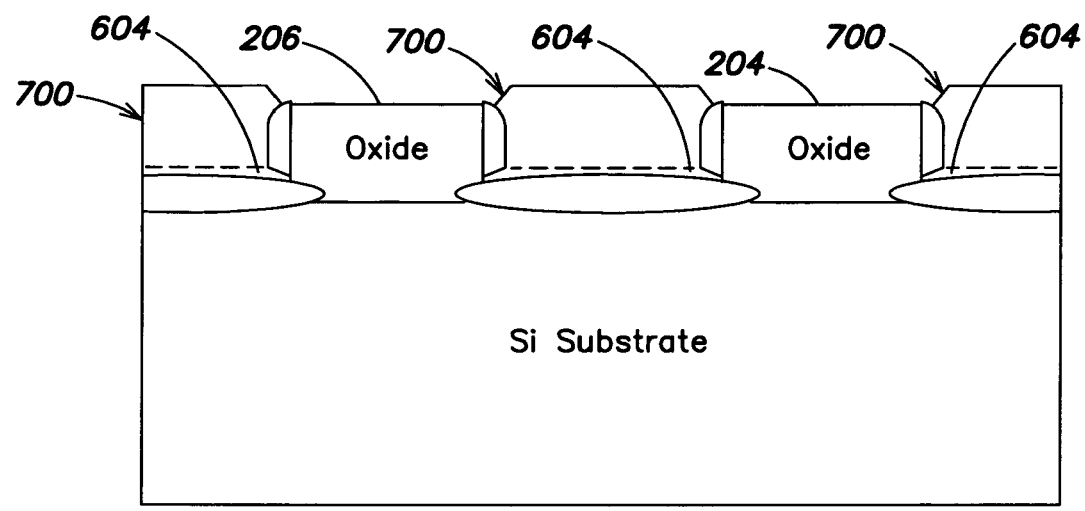
FIG. 7 illustrates a step of the first exemplary method of forming a low-stress patterned SOI layer in which a second epitaxial layer is grown on the substrate in accordance with an embodiment of the present invention.

As stated, the portions 604 of the first epitaxial layer 300 may serve as seed layers on which additional silicon may be grown. For example, FIG. 7 illustrates a step of the first exemplary method of forming a low-stress patterned SOI layer in which a second epitaxial layer is grown on the substrate in accordance with an embodiment of the present invention. With reference to FIG. 7, the second epitaxial layer 700 may be grown on each portion 604 (shown in phantom in FIG. 7) of the first epitaxial layer (300 in FIG. 6). Because the portions 604 are high-quality silicon, the second epitaxial layer 700 formed on the same also high-quality silicon. The second epitaxial layer 700 may be grown to a height such that a top surface of the second epitaxial layer 700 is above a top surface of the one or more oxide regions 204-206. However, the second epitaxial layer 700 may be grown to a larger or smaller height.

In some embodiments, to prepare for growth of the second epitaxial layer 700 a chemical oxide removal (CORE) etch or a similar process may be performed on a top surface of the first epitaxial layer 300 (e.g., a top surface of each portion 604) to remove thermal oxide (e.g., ITOX oxide) from the same. In contrast to other etching processes, CORE etching may remove thermal oxide quickly, and therefore, may reduce consumption of the one or more oxide regions 204-206 during etching.

Figure 8:
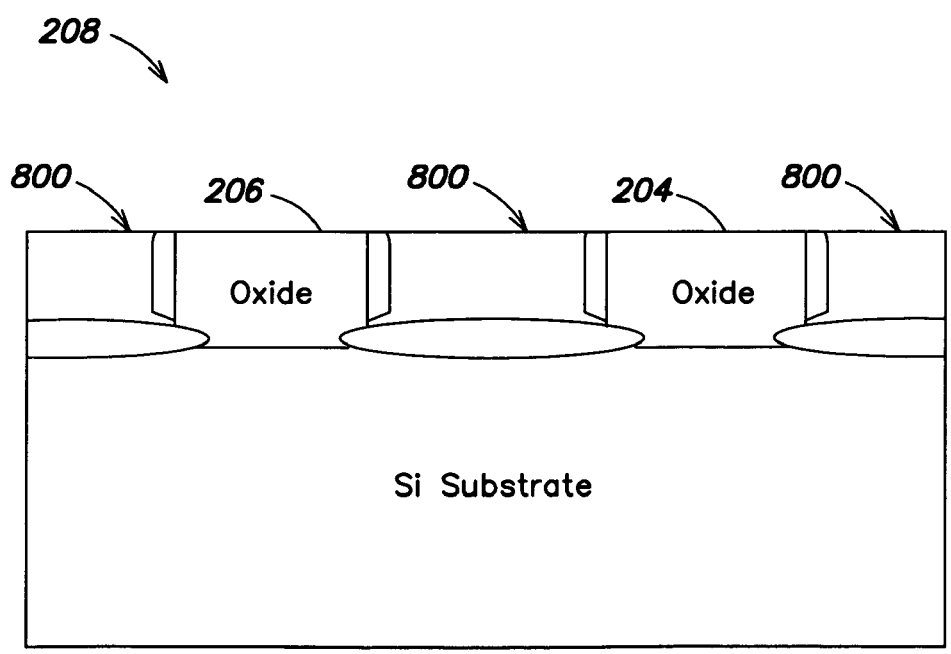
FIG. 8 illustrates a step of the first exemplary method of forming a low-stress patterned SOI layer in which a surface of the substrate being manufactured is planarized in accordance with an embodiment of the present invention.

FIG. 8 illustrates a step of the first exemplary method of forming a low-stress patterned SOI layer in which a surface of the substrate being manufactured 208 is planarized in accordance with an embodiment of the present invention. With reference to FIG. 8, the second epitaxial layer (700 in FIG. 7) may be planarized and polished to a top surface of the oxide regions 204-206 to yield SOI regions 800. Chemical Mechanical Planarization (CMP) or another suitable technique may be employed to planarize and polish the second epitaxial layer 700. In some embodiments, a signature from the nitride spacers may be detected, and a predetermined time thereafter, polishing may stop (although polishing may stop in a different manner). In this manner, presence of nitride may emit a distinct signature when etched, and therefore, may be used as an "endpoint" detector.

In this manner, the substrate 208 is prepared for normal processing (e.g., for chip fabrication). Therefore, electronic devices may be formed on the substrate 208.

Through use of the first exemplary method, a substrate 208 including thin (e.g., ultra-thin) high-quality regions of silicon may result from implanting oxygen into selected regions of a bulk substrate using low energy. Additionally, a layer of silicon may be grown epitaxially on the thin silicon regions. More specifically, oxygen may be implanted into a bulk substrate using low energy to form thin silicon regions overlying regions of the implanted oxygen. Annealing may be employed to heal damage caused to portions of the thin silicon regions while implanting oxygen and to completely form a buried oxide underlying the thin silicon layer. Finally, an epitaxial layer, which uses portions of the thin silicon regions as a seed, is grown. In this manner, an SOI layer 800 of a desired thickness may be formed. The first exemplary method may be thought of as an extension of a separation by implanting oxygen (SIMOX) process, whereby an epitaxial layer is grown on an ultra-thin SIMOX layer.

Figure 9:
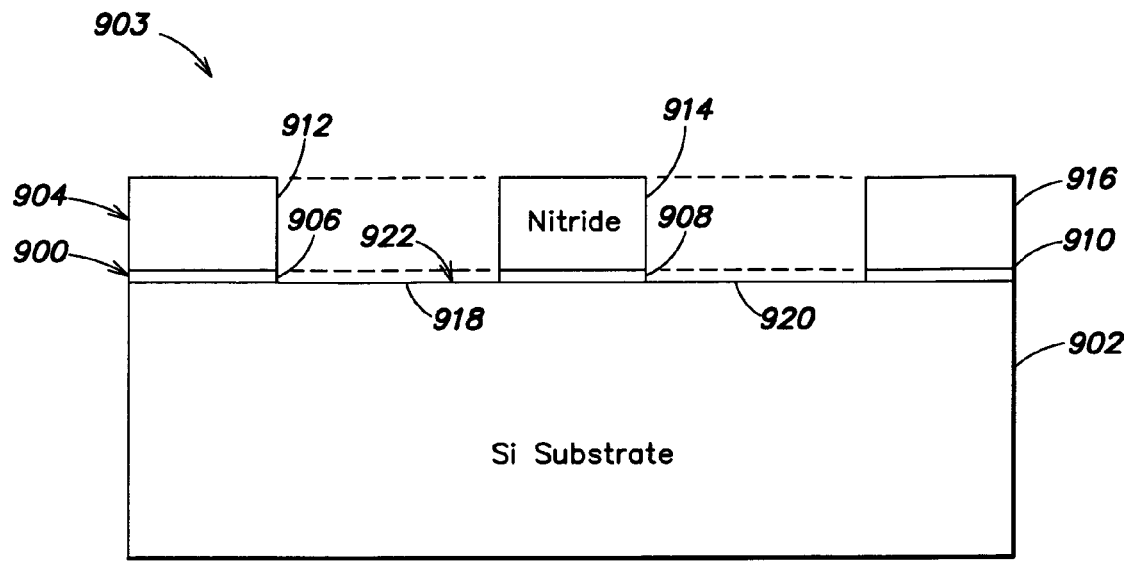
FIG. 9 illustrates a step of a second exemplary method of forming a low-stress patterned SOI layer in which a layer of pad nitride over a layer of pad oxide is patterned on a substrate being manufactured in accordance with an embodiment of the present invention.

FIGS. 9-17 are side cross-sectional views of a substrate illustrating a second exemplary method of forming a low-stress patterned SOI layer in accordance with an embodiment of the present invention. More specifically, FIG. 9 illustrates a step of the second exemplary method of forming a low-stress patterned SOI layer in which pad nitride over pad oxide is patterned on a substrate being manufactured in accordance with an embodiment of the present invention. With reference to FIG. 9, in a second embodiment, a layer of pad oxide 900 (shown in phantom) may be formed on a silicon bulk substrate 902 of the substrate being manufactured 903 using thermal oxidation, CVD or another suitable process. The layer of pad oxide 900 may be about 3 nm to about 20 nm thick (although a larger or smaller and/or different thickness range may be employed). Thereafter, a layer of pad nitride 904 may be deposited on the layer of pad oxide 900. The layer of pad nitride 904 may be about 100 nm to about 500 nm thick (although a larger or smaller and/or different thickness range may be employed). RIE or another suitable etching process may be employed to remove portions of the pad oxide layer 900 and/or the pad nitride layer 904. Therefore, portions 918, 920 of a top surface 922 of the bulk substrate 902 may be exposed. In this manner, the pad oxide layer 900 may be patterned into pad oxide regions 906-910, and similarly, the pad nitride layer 904 may be patterned into pad nitride regions 912-916. The pad oxide regions 906-910 may serve to promote adhesion of the pad nitride to the substrate 903, by relieving mechanical stress. For example, the pad oxide regions 906-910 may absorb a thermal mismatch between the pad nitride regions 912-916 and the underlying silicon 902, thus avoiding damage to the silicon.

Figure 10:
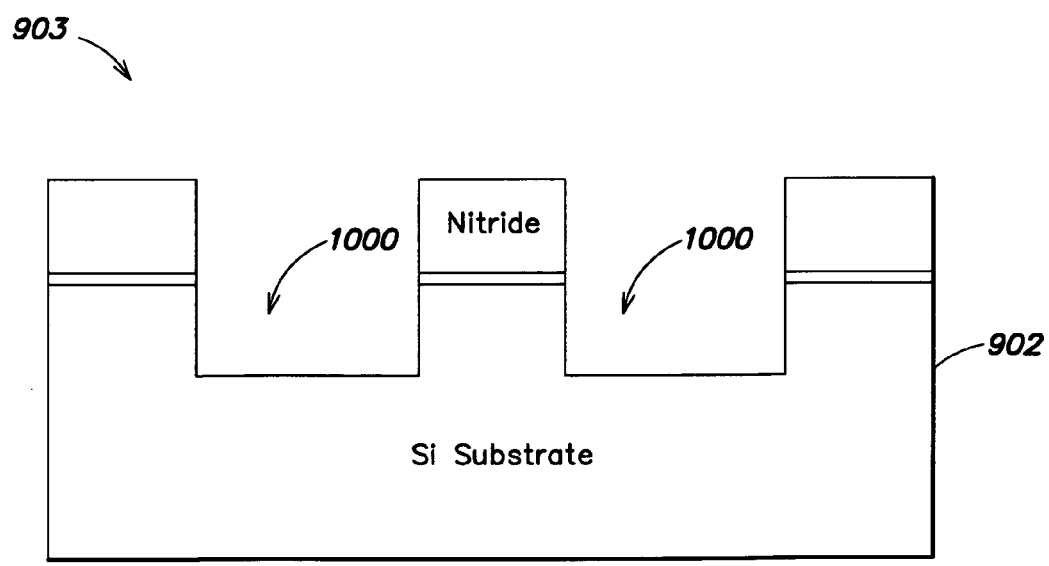
FIG. 10 illustrates a step of the second exemplary method of forming a low-stress patterned SOI layer in which trenches are formed in a bulk substrate in accordance with an embodiment of the present invention.

FIG. 10 illustrates a step of the second exemplary method of forming a low-stress patterned SOI layer in which trenches are formed in the bulk substrate 902 in accordance with an embodiment of the present invention. With reference to FIG. 10, RIE or a similar anisotropic process may be employed to recess one or more exposed portions (918, 920 in FIG. 9) of the bulk substrate 902. In this manner, RIE may form trenches 1000 with steep vertical walls. One or more of the trenches 1000 formed in the bulk substrate 902 may be about 20 nm to about 100 nm deep (although a larger or smaller and/or different depth range may be employed). The depth of the one or more trenches 1000 may be selected such that the trenches 1000 may accommodate the thickness of subsequently formed SOI layers (e.g., thin silicon layers overlying respective buried oxide layers) on the substrate 903.

Figure 11:
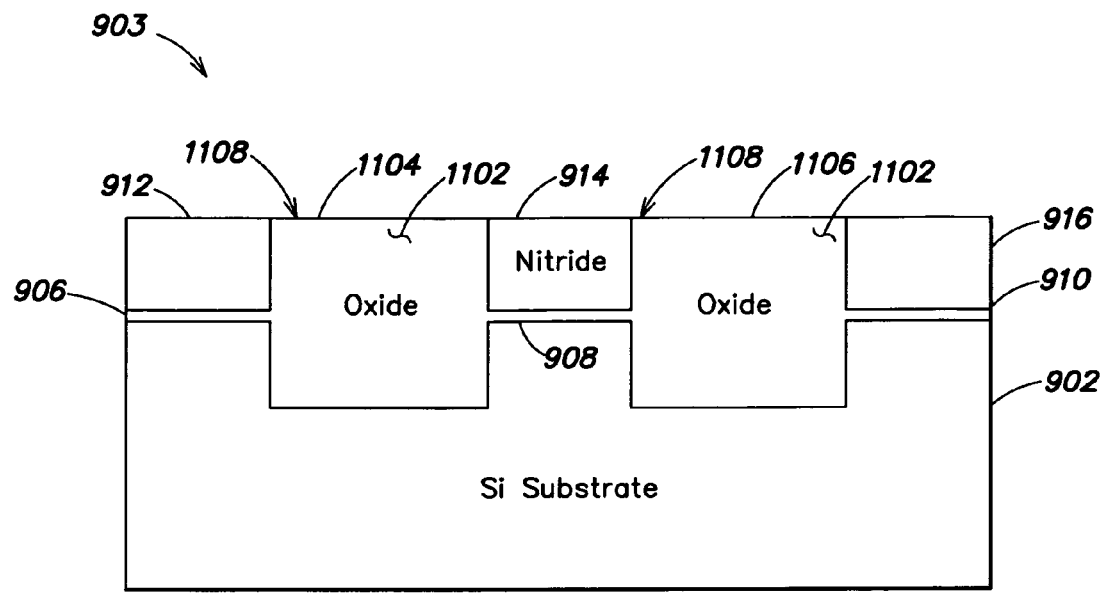
FIG. 11 illustrates a step of the second exemplary method of forming a low-stress patterned SOI layer in which oxide is deposited into the trenches of the substrate in accordance with an embodiment of the present invention.

FIG. 11 illustrates a step of the second exemplary method of forming a low-stress patterned SOI layer in which oxide is deposited into the trenches of the substrate in accordance with an embodiment of the present invention. With reference to FIG. 11, CVD or another suitable technique may be employed to deposit oxide 1102 (e.g., using a Tetraethylorthosilicate (TEOS) precursor, by using a high-density plasma (HDP) deposition, etc.) onto the substrate 903. In this manner, oxide may be deposited into the trenches (1000 in FIG. 10) formed in the bulk substrate 902, into spaces between the pad oxide and pad nitride regions 906-910, 912-916 (e.g., over the trenches 1000), atop the pad nitride regions 912-916 and/or atop spaces between the pad nitride regions 912-916.

CMP or another suitable process may be performed to planarize the deposited oxide to respective top surfaces of the pad nitride regions 912-916. A densification annealing process may be performed on the substrate 903 to densify the deposited oxide. In this manner, one or more oxide regions 1104-1106 may be formed. At this point in the second exemplary method, one or more oxide-filled shallow trench isolation (STI) regions 1108 have been formed in the substrate 903. The STI regions 1108 may extend above a top surface of the bulk substrate 902. Further, the height of the STI regions above the top surface of the bulk substrate 902 may determine, in part, the thickness of the subsequently-formed SOI layer.

Figure 12:
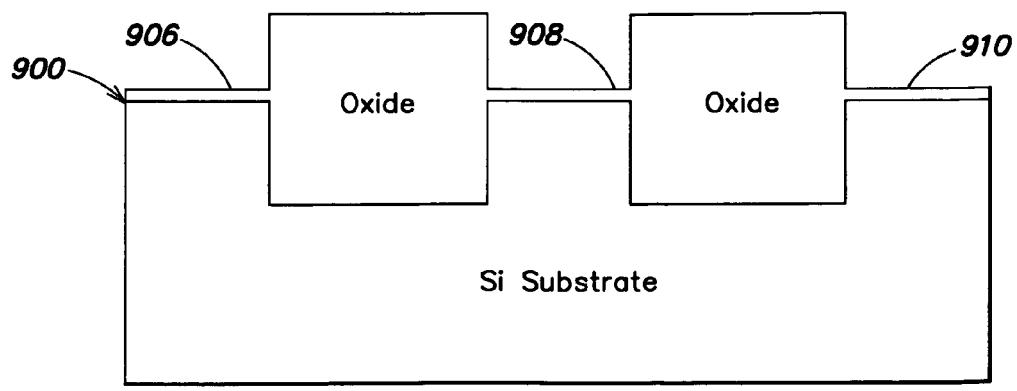
FIG. 12 illustrates a step of the second exemplary method of forming a low-stress patterned SOI layer in which nitride is removed from the substrate in accordance with an embodiment of the present invention.

FIG. 12 illustrates a step of the second exemplary method of forming a low-stress patterned SOI layer in which nitride is removed from the substrate in accordance with an embodiment of the present invention. With reference to FIG. 12, an etching process may be employed to remove the pad nitride regions (912-916 in FIG. 11) from atop the pad oxide regions (906-910 in FIG. 11). Hot acid (e.g., phosphoric acid) or the like may be employed to etch the pad nitride regions 912-916 from the pad oxide regions 906-910.

Figure 13:
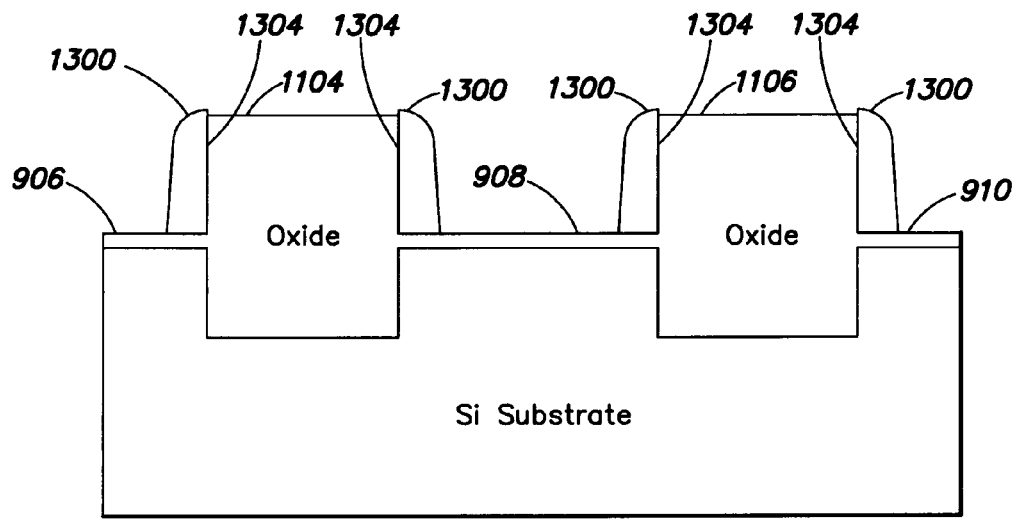
FIG. 13 illustrates a step of the second exemplary method of forming a low-stress patterned SOI layer in which nitride spacers are formed adjacent oxide regions in accordance with an embodiment of the present invention.

FIG. 13 illustrates a step of the second exemplary method of forming a low-stress patterned SOI layer in which nitride spacers are formed adjacent oxide regions in accordance with an embodiment of the present invention. With reference to FIG. 13, nitride spacers 1300 may be formed on sidewalls 1304 of the oxide regions 1104-1106. To form the nitride spacers 1300, CVD or another suitable method may be employed to deposit a layer of nitride (e.g., atop the pad oxide regions 906-910). Thereafter, a directional etching process such as RIE may be employed to remove unwanted portions of the deposited nitride layer. The nitride spacers 1300 may serve to prevent deformation of the oxide regions 1104-1106 due to reflow cause by subsequent processing, such as high-temperature annealing or the like. Forming nitride spacers 1300 may be an optional step of the second exemplary method.

Figure 14:
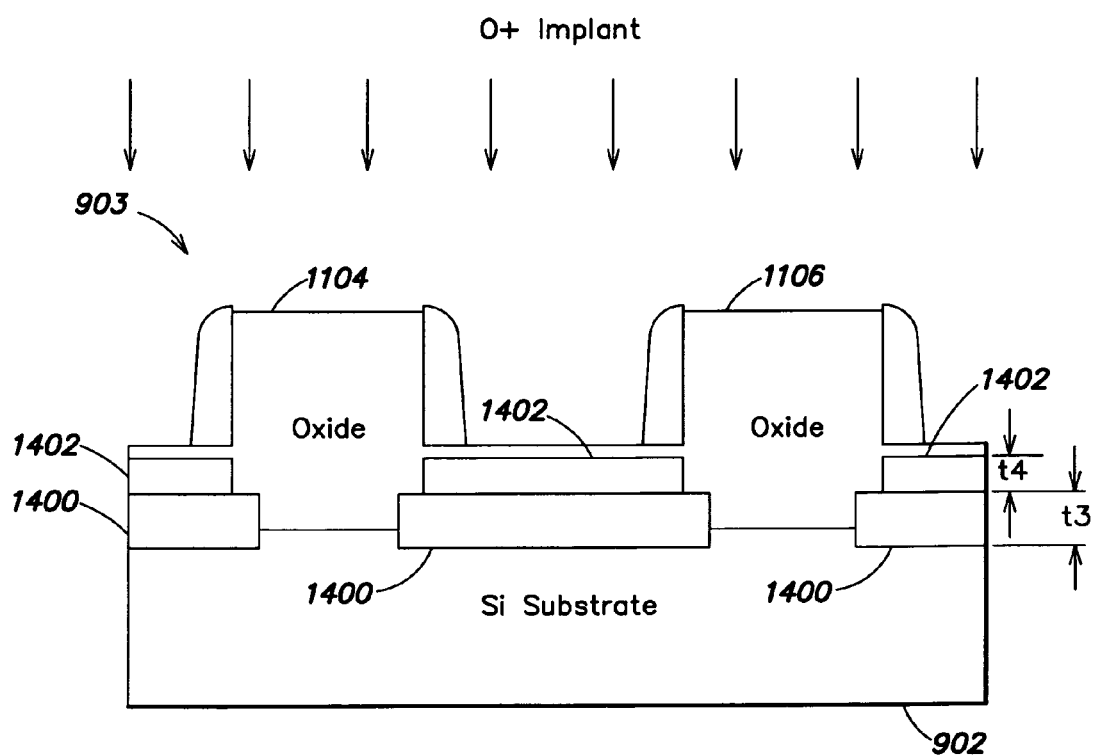
FIG. 14 illustrates a step of the second exemplary method of forming a low-stress patterned SOI layer in which in which oxygen is implanted into the substrate in accordance with an embodiment of the present invention.

FIG. 14 illustrates a step of the second exemplary method of forming a low-stress patterned SOI layer in which in which oxygen is implanted into the substrate in accordance with an embodiment of the present invention. With reference to FIG. 14, similar to the oxygen-implanting step of the first exemplary method, oxygen (e.g., ionized atomic or molecular oxygen) may be implanted into the substrate 902 using low energy. The implanted oxygen may form a buried oxide layer including selected implant regions 1400. In contrast to the first exemplary method, the oxygen may be implanted such that the formed oxide will be entirely buried in the substrate 902. Energy for implanting oxygen may be selected such that the peak of the implanted oxygen is located below the original top surface of the silicon substrate 902. For example, a dose of about $2\times10^{17}$ to about $2\times10^{18}$ cm$^{-2}$ O$^+$ may be implanted using about 20 keV to about 100 keV of energy. Such an energy level may reduce and/or eliminate damage caused to the structure (e.g., lattice) of the silicon in top portions 1402 of the substrate 902 (e.g., caused by the passage of the oxygen). More specifically, compared to conventional methods, the lower energy employed by the present method to implant oxygen may cause the oxygen to bombard the substrate 903 at a slower velocity, and therefore, reduce damage caused to the structure of silicon in the top portions 1402 of the substrate 902 by the passage of the oxygen. Further, employing such a lower energy to implant oxygen may result in shallow selected implant regions 1400. In one embodiment, the selected implant regions 1400 may have a thickness t3 of about 20 nm to about 100 nm (although a larger or smaller and/or different thickness range may be employed). Consequently, as described in detail below, the top portions 1402 of the substrate 902, hereinafter referred to as seed layer 1402, which overlie the selected implant regions 1400, may be thin. For example, the seed layer 1402 of the substrate 902 may have a thickness t4 of about 5 nm to about 50 nm (although a larger or smaller and/or different thickness range may be employed). It should be noted that the dose range described above may be lower than that employed by conventional methods employed to implant oxygen.

A temperature of about 400° C. to about 700° C. may be employed to implant the oxygen. Such an elevated temperature range may further reduce damage to the silicon structure (e.g., of the seed layer 1402) caused by the implanted oxygen and/or increase the solubility of the implanted oxygen into the silicon (e.g., of the substrate 902).

The above dose, energy and temperature ranges are exemplary. Therefore, a larger or smaller range and/or different range may be employed for the dose, energy and/or temperature. Further, although in the example above O$^+$ was implanted into the substrate 903, in other embodiments, ionized molecular oxygen, such as O$_2^+$, may be implanted. Compared to O$^+$, implanting O$_2^+$ using the same process parameters (e.g., dose, energy and/or temperature range) may result in thinner seed 1402 and buried oxide 1400 layers.

Figure 15:
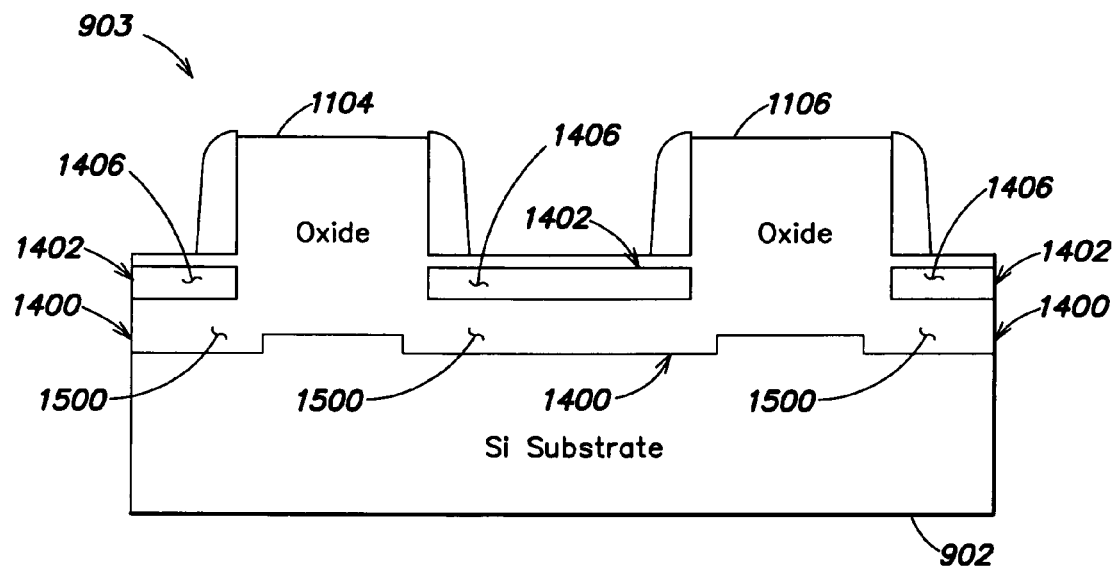
FIG. 15 illustrates a step of the second exemplary method of forming a low-stress patterned SOI layer in which the substrate undergoes annealing in accordance with an embodiment of the present invention.

At this point of the second exemplary method, the selected implant regions 1400 include ionized atomic or molecular oxygen. Further, the seed layer 1402 of the substrate 902 may include some damage caused by passage of the implanted oxygen. FIG. 15 illustrates a step of the second exemplary method of forming a low-stress patterned SOI layer in which the substrate undergoes annealing in accordance with an embodiment of the present invention. With reference to FIG. 15, similar to the annealing step of the first exemplary method, the substrate being manufactured 903 may be subjected to an annealing process in which any structural damage to the seed layer 1402 of the substrate 902 caused while implanting oxygen may be repaired. Further, annealing may completely form the buried oxide layer. More specifically, before annealing, the selected implant regions 1400 may include implanted ionized atomic or molecular oxygen. However, annealing causes the oxygen to combine (e.g., chemically) with silicon surrounding the selected implant regions 1400. For example, annealing may cause oxygen implanted in the selected implant regions 1400 to combine with silicon in portions of the substrate 902 to form silicon dioxide SiO$_2$ regions 1500, which serve as an insulator. During this time, the selected implant regions 1400 may increase in volume as the oxygen and silicon combine chemically, and thin the seed layer 1402 of the substrate 902 overlying the selected implant regions 1400. However, because the seed layer 1402 of the substrate 902 are thin, structural damage (e.g., dislocations) to silicon in the portions 1402 is reduced and/or minimized. Further, the oxide regions 1104, 1106 may serve to absorb stress created by the volume expansion of the selected implant regions 1400 during annealing, and thereby, reduce structural damage caused to silicon in the seed layer 1402. In this manner, silicon 1406 in the seed layer 1402 of the substrate 902 may be of a high quality (e.g., include little or no damage). As described below, the seed layer 1402 of the substrate 902 may serve as a seed for future epitaxial growth. After annealing, the seed layer 1402 of the substrate may be a single crystal semiconductor region. The seed layer may be about 3 nm to about 55 nm thick (although a larger or smaller thickness may be employed). The seed layer may be a single crystal semiconductor region.

Similar to the first exemplary method, in the second exemplary method, annealing may be performed using temperatures of about 1100° C. to about 1300° C. (although a larger or smaller and/or different temperature range may be employed). Annealing may be performed, for example, in an inert ambient environment. Alternatively, annealing may be performed in an oxidizing ambient environment such as an internal total oxidation (ITOX) environment. Annealing in such an environment may thicken the selected implant regions 1400, which eventually form the buried oxide layer, as the buried oxide forms. Consequently, the annealing may thin the seed layer 1402 of the substrate 902 overlying the selected implant regions 1400 more than annealing using the same temperature range in an inert ambient environment.

Figure 16:
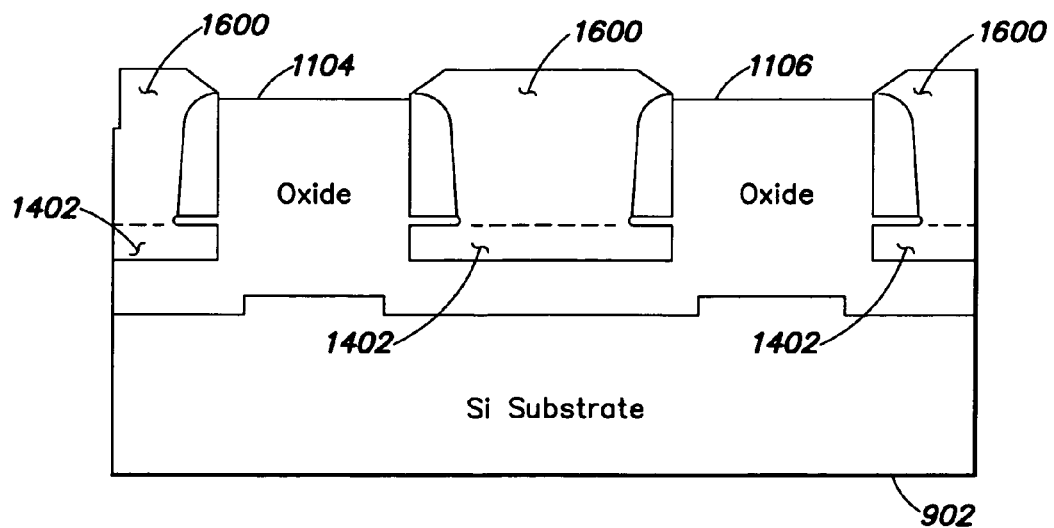
FIG. 16 illustrates a step of the second exemplary method of forming a low-stress patterned SOI layer in which an epitaxial layer is grown on the substrate in accordance with an embodiment of the present invention.

FIG. 16 illustrates a step of the second exemplary method of forming a low-stress patterned SOI layer in which an epitaxial layer is grown on the seed layer 1402 of the substrate in accordance with an embodiment of the present invention. With reference to FIG. 16, exposed portions of the pad oxide regions (906-910 in FIG. 13) overlying the seed layer 1402 (shown in phantom in FIG. 16) of the substrate 902 may be removed. For example, CORE etching or another suitable process may be employed to strip exposed portions of the pad oxide regions 906-910 from the seed layer 1402 of the substrate 902. Further, the CORE etching or another suitable process may be employed to remove thermal oxide (e.g., ITOX) from the seed layer 1402 of the substrate 902. As stated, in contrast to other etching processes, CORE etching may remove thermal oxide quickly, and therefore, reduce consumption of the oxide 1102 during etching. In this manner, the seed layer 1402 of the substrate may be prepared to serve as a seed for epitaxial silicon growth. A layer 1600 of silicon may be epitaxially grown on the seed layer 1402 of the substrate 902. For example, silicon may be epitaxially grown higher than the oxide regions 1104-1106.

Figure 17:
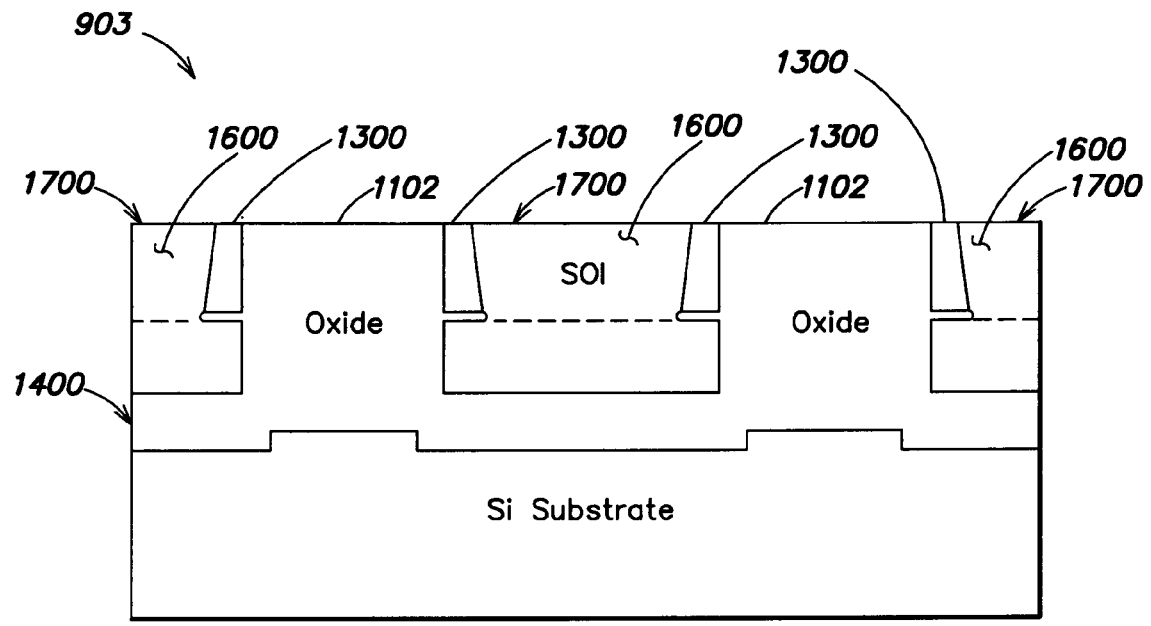
FIG. 17 illustrates a step of the second exemplary method of forming a low-stress patterned SOI layer in which the substrate being manufactured is planarized in accordance with an embodiment of the present invention.

FIG. 17 illustrates a step of the second exemplary method of forming a low-stress patterned SOI layer in which the substrate being manufactured is planarized in accordance with an embodiment of the present invention. With reference to FIG. 17, CMP or another suitable process may be performed to planarize the epitaxially grown layer 1600 to respective top surfaces of the oxide 1102. In some embodiments, a signature from the nitride spacers may be detected, and a predetermined time thereafter, polishing may stop (although polishing may stop in a different manner). Therefore, portions of the nitride spacers 1300 may be planarized. In this manner, the substrate being manufactured is prepared for normal processing (e.g., for chip fabrication). Therefore, electronic devices may be formed on the substrate. More specifically, the second exemplary method results in one or more regions of silicon 1700 (e.g., top portions 1402 of the substrate 903 and the epitaxial silicon layer 1600 grown thereon, both shown in phantom in FIG. 17) formed on a layer of buried oxide formed from the selected implant regions 1400 that serves as an insulator. Therefore, the one or more regions of silicon 1700 serve as SOI regions upon which one or more electronic devices (e.g., high-performance devices, such as devices with high switching speeds) may be formed.

Similar to the first exemplary method, through use of the second exemplary method, a substrate 903 including a thin high-quality layer of silicon on insulator may result from implanting oxygen using low energy into a bulk substrate. Additionally, a layer of silicon may be grown epitaxially on the thin layer. More specifically, oxygen may be implanted into a bulk substrate using low energy to form an SOI region including the thin silicon layer. Annealing may be employed to heal damage caused to the thin silicon layer while implanting oxygen, and to completely form the buried oxide underlying the thin silicon layer. Finally, an epitaxial layer, which uses the thin silicon layer as a seed layer, is grown. In this manner, an SOI layer 1700 of a desired thickness may be formed. The second exemplary method may be thought of as growing an epitaxial layer on an ultra-thin SOI layer formed by a SIMOX process adjacent raised oxide regions.

Figure 18:
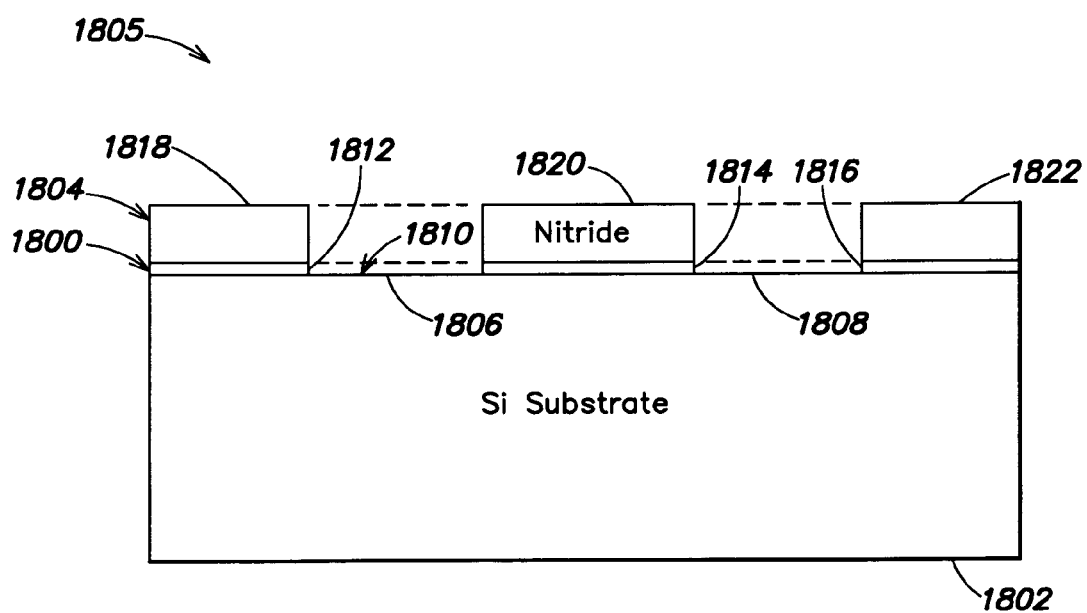
FIG. 18 illustrates a step of a third exemplary method of forming a low-stress patterned SOI layer in which nitride and oxide is patterned on a substrate in accordance with an embodiment of the present invention.

FIGS. 18-22 are side cross-sectional views of a substrate illustrating a third exemplary method of forming a low-stress patterned SOI layer in accordance with an embodiment of the present invention. More specifically, FIG. 18 illustrates a step of the third exemplary method of forming a low-stress patterned SOI layer in which nitride and oxide is patterned on a substrate being manufactured in accordance with an embodiment of the present invention. With reference to FIG. 18, similar to the step of the second exemplary method illustrated in FIG. 9, in the third exemplary method, a layer of pad oxide 1800 (shown in phantom) may be formed on a silicon bulk substrate 1802 using thermal oxidation or CVD or another suitable process. The layer of pad oxide 1800 may be about 3 nm to about 20 nm thick (although a larger or smaller and/or different thickness range may be employed). Thereafter, a layer of pad nitride 1804 (shown in phantom) may be deposited on the layer of pad oxide 1800 (although deposition of the layer of pad nitride 1804 is not required by the third exemplary method). The layer of pad nitride 1804 may be about 10 nm to about 100 nm thick (although a larger or smaller and/or different thickness range may be employed). Therefore, the layer of pad nitride 1804 deposited in the third exemplary method may be thinner than the layer of pad nitride 904 deposited in the second exemplary method.

RIE or another suitable etching process may be employed to remove portions of the pad nitride layer 1804 and pad oxide layer 1800 from the substrate being manufactured 1802. Therefore, portions 1806, 1808 of a top surface 1810 of the bulk substrate 1802 may be exposed. In this manner, the pad oxide layer 1800 may be patterned into pad oxide regions 1812-1816, and similarly, the pad nitride layer 1804 may be patterned into pad nitride regions 1818-1822. As explained earlier, the pad oxide regions 1812-1816 may serve to promote adhesion of the nitride regions 1818-1822. Additionally or alternatively, the pad oxide regions 1812-1816 may serve as stress relief regions. For example, the pad oxide regions 1812-1816 may prevent a mismatch in thermal expansion between the pad nitride regions 1818-1822 and substrate 1802 (e.g., due to high temperature processing) from damaging the underlying silicon. As described further below, regions of silicon below the pad oxide regions 1812-1816 and pad nitride regions 1818-1822 may be active regions (e.g., employed for active devices). Remaining silicon regions may be isolation regions.

Figure 19:
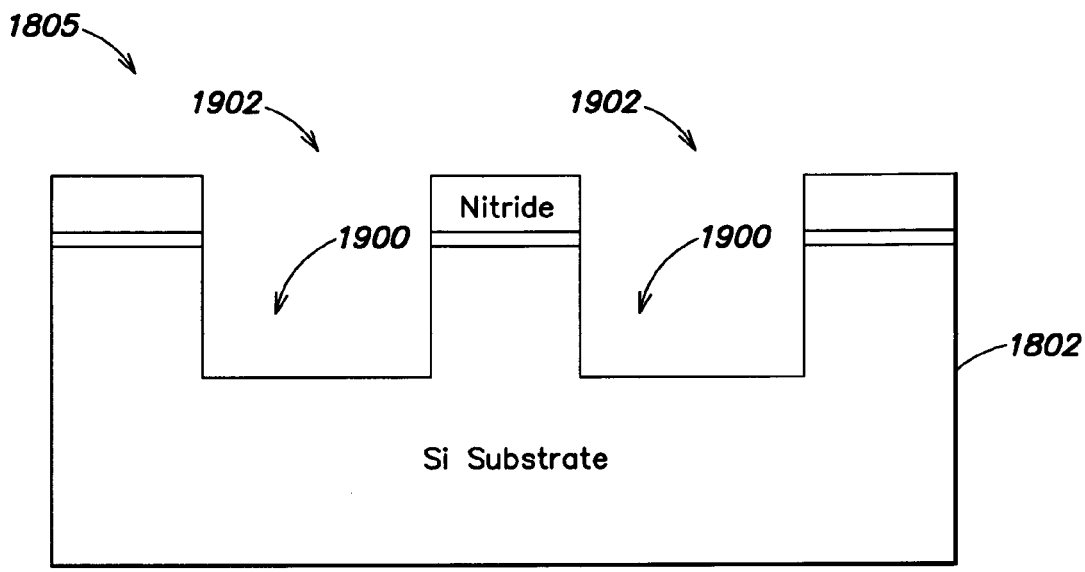
FIG. 19 illustrates a step of the third exemplary method of forming a low-stress patterned SOI layer in which trenches are formed in the substrate in accordance with an embodiment of the present invention.

FIG. 19 illustrates a step of the third exemplary method of forming a low-stress patterned SOI layer in which trenches are formed in the substrate in accordance with an embodiment of the present invention. With reference to FIG. 19, similar to the step of the second exemplary method illustrated FIG. 10, in the third exemplary method, RIE or a similar anisotropic etching process may be employed to recess one or more exposed portions (1806, 1808 in FIG. 18) of the substrate 1802. In this manner, RIE may form trenches 1900 with steep vertical walls. One or more of the trenches 1900 formed in the substrate 1802 may be about 50 nm to about 350 nm deep (although a larger or smaller and/or different depth range may be employed). The depth of the one or more trenches 1900 may be selected such that the trenches 1900 provide isolation between adjacent active regions (described below) that may be formed on the substrate 1802. In this manner, shallow trench isolation (STI) regions 1902 have been formed.

Figure 20:
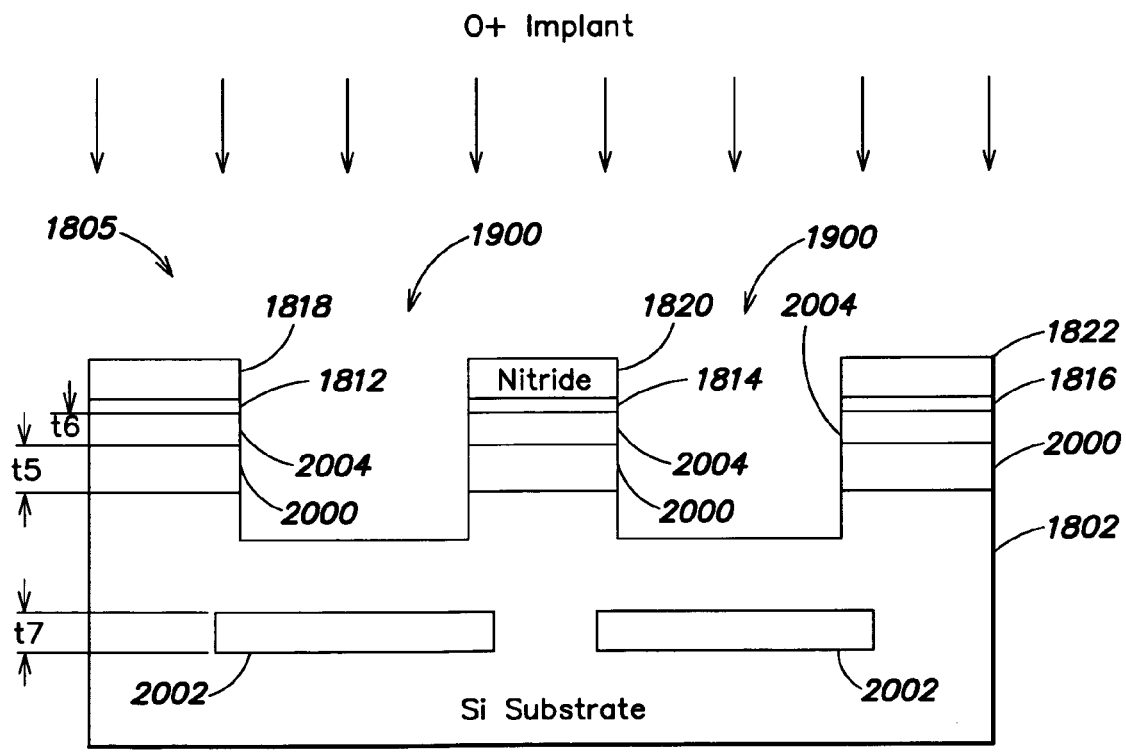
FIG. 20 illustrates a step of the third exemplary method of forming a low-stress patterned SOI layer in which in which oxygen is implanted into the substrate in accordance with an embodiment of the present invention.

FIG. 20 illustrates a step of the third exemplary method of forming a low-stress patterned SOI layer in which oxygen is implanted into the substrate in accordance with an embodiment of the present invention. With reference to FIG. 20, similar to the respective oxygen-implanting steps of the first and second exemplary methods, oxygen (e.g., ionized atomic or molecular oxygen) may be implanted into the bulk substrate 1802 to form first and second selected implant regions 2000, 2002 using low-energy. Energy for implanting oxygen may be selected such that the peak of the implanted oxygen below the pad oxide and pad nitride regions 1812-1816, 1818-1822 is located at a distance below the original surface of the silicon bulk substrate 1802 consistent with producing the desired thickness of the subsequently formed thin silicon. For example, a dose of about $2 \times 10^{17}$ to about $5 \times 10^{18}$ cm$^{-2}$ O$^+$ may be implanted using about 25 keV to about 200 keV of energy. Such an energy level may reduce and/or eliminate damage caused to the structure (e.g., lattice) of the silicon in top portions 2004 of the substrate 1802 (e.g., by the passage of the oxygen). More specifically, compared to conventional methods, the lower energy employed by the present method to implant oxygen may cause the oxygen to bombard the substrate at a lower velocity, and therefore, reduce damage caused to the structure of the silicon in the top portions 2004 of the substrate 1802 caused by the passage of the oxygen. Further, employing such a lower energy to implant oxygen may result in shallow selected implant regions 2004. Consequently, as described in detail below, the top portions 2004 of the substrate 1802, which overlie the first selected implant regions 2000, are thin.

Additionally, the thickness of the pad nitride regions 1818-1822 is selected to allow implanted oxygen ions to pass therethrough. However, the pad nitride regions 1818-1822 may reduce the penetration depth of the implanted oxygen, and therefore, the first selected implant regions 2000 from forming as deep in the substrate 1802 as when the pad nitride regions 1818-1822 are not present. Therefore, the pad nitride regions 1818-1822 may further thin the top portions 2004 of the substrate 1802. For example, the first selected implant regions 2000 may have a thickness t5 about 20 nm to about 100 nm, and the top portions 2004 of the bulk substrate 1802 may have a thickness t6 of about 3 nm to about 55 nm (although a larger or smaller and/or different thickness ranges may be employed). It should be noted that the dose range described above may be lower than that employed by conventional methods employed to implant oxygen.

The trenches 1900 enable the second selected implant regions 2002 to be deeper than the first selected implant regions 2000. Further, because a nitride pad or a similar region is not deposited on the bottom of the trenches 1900, the second selected implant regions 2002 may be deeper in the substrate 1802 than when the trenches are lined with nitride or similar material. In one embodiment, the second selected implant regions 2002 have a thickness t7 of about 20 nm to about 100 nm (although a larger or smaller and/or different thickness range may be employed). Further, the upper edge of the second selected implant regions 2002 may be about 20 nm to about 200 nm below the bottom of the trenches 1900 (although the second selected implant regions 2002 may be deeper or shallower).

Similar to the first and second exemplary methods, a temperature of about 400° C. to about 700° C. may be employed to implant the oxygen. Such an elevated temperature range may further reduce damage to silicon structure (e.g., in the top portions 2004 of the bulk substrate 1802) caused by the implanted oxygen and/or increase the solubility of the implanted oxygen into the silicon (e.g., of the bulk substrate 1802).

The above dose, energy and temperature ranges are exemplary. Therefore, a larger or smaller and/or different range may be employed for the dose, energy and/or temperature. Further, although in the example above O$^+$ was implanted into the substrate 1802, in other embodiments, ionized molecular oxygen, such as O$_2^+$, may be implanted. Compared to O$^+$, implanting O$_2^+$ using the same process parameters (e.g., dose, energy and/or temperature range) may result in shallower selected implant regions 2000, 2002.

Figure 21:
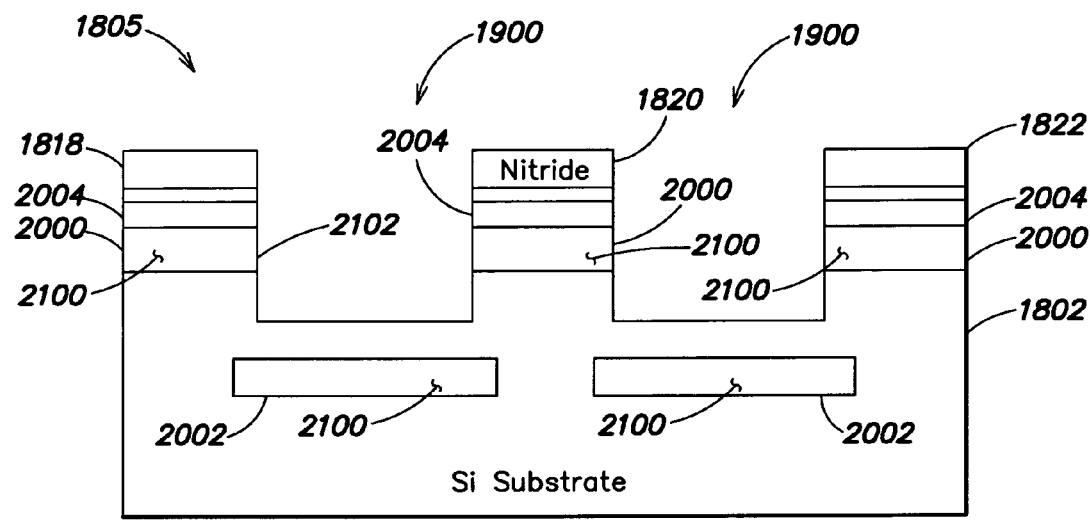
FIG. 21 illustrates a step of the third exemplary method of forming a low-stress patterned SOI layer in which the substrate being manufactured undergoes annealing in accordance with an embodiment of the present invention.

At this point of the third exemplary method, the first and second selected implant regions 2000, 2002 include ionized atomic or molecular oxygen. Further, the top portions 2004 of the substrate 1802 may include some damage caused by passage of the implanted oxygen. FIG. 21 illustrates a step of the third exemplary method of forming a low-stress patterned SOI layer in which the substrate being manufactured undergoes annealing in accordance with an embodiment of the present invention. With reference to FIG. 21, similar to the annealing step of the first and second exemplary methods, the substrate 1802 may be subjected to an annealing process in which any structural damage to the top portions 2004 of the substrate 1802 caused while implanting oxygen may be repaired. For example, damage to the silicon structure (e.g., lattice) caused by oxygen implanting may be repaired. Further, annealing may completely form the buried oxide layer. More specifically, before annealing, the first and second selected implant regions 2000, 2002 may include implanted ionized atomic or molecular oxygen. However, annealing causes the oxygen to combine (e.g., chemically) with silicon within and surrounding the first and second selected implant regions 2000, 2002. For example, annealing may cause oxygen implanted in the first and second selected implant regions 2000, 2002 to combine with silicon in portions of the substrate 1802 to form silicon dioxide SiO$_2$ regions 2100, which may serve as an insulator. In this manner, annealing may convert the first selected implant regions 2000 into a shallow buried oxide layer in active regions of the substrate 1802, and convert the second selected implant regions 2002 into a deep buried oxide layer under isolation regions of the substrate being manufactured 1805.

During this time, as the chemical combination of oxygen and silicon proceeds, the volume of oxide associated with first and/or second selected implant regions 2000, 2002 may increase and thin the top portions 2004 of the substrate 1802 overlying the first selected implant regions 2000. However, because one or more sidewalls 2102 of the first selected implant regions 2000 may be adjacent a trench 1900 and the overlying top portions 2004 are thin, the first selected implant regions 2000 may expand laterally and/or vertically without restraint. Therefore, expansion of the first selected implant regions 2000 from annealing causes little or no stress in the top portions 2004. Consequently, few or no dislocations may develop in the top portions 2004. In this manner, the silicon in the top portions 2004 of the substrate 1802 after annealing may be of a high quality (e.g., include little or no damage).

In contrast, expansion of the second selected implant regions 2002 from annealing may create greater stress, and therefore, damage in surrounding silicon of the substrate 1802. However, due to the location (e.g., depth) of the second selected implant region 2002, the stress may not impact the top portions 2004 of the substrate 1802. Further, the damage below the first selected implant region 2000 may improve a radiation hardness of the substrate 1802.

Similar to the first and second exemplary methods, in the third exemplary method, annealing may be performed using temperatures of about 1100° C. to about 1300° C. (although a larger or smaller and/or different temperature range may be employed). Annealing may be performed, for example, in an inert ambient environment. Alternatively, annealing may be performed in an oxidizing ambient environment such as an internal total oxidation (ITOX) environment. Annealing in such an environment during the third exemplary method may thicken the oxide associated with the first selected implant region 2000. Specifically, the nitride pad regions 1818-1822 may reduce an amount of oxygen that diffuses, inhibiting oxygen from diffusing into the top portions 2004 of the silicon 1802. However, oxygen may diffuse through sidewalls of the trenches 1900 primarily thickening the lower portion of the first selected implant region 2000 without significantly consuming the top portions 2004 of the substrate 1802. Consequently, oxide may form along sidewalls of the trenches 1900 which may passivate damage from RIE or similar processes.

Figure 22:
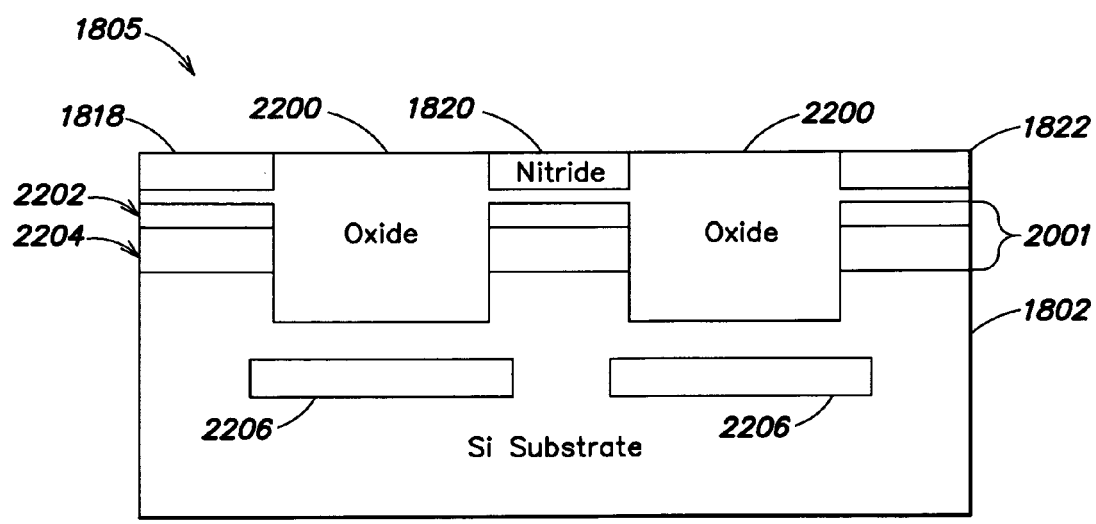
FIG. 22 illustrates a step of the third exemplary method of forming a low-stress patterned SOI layer in which oxide is deposited into the trenches of the substrate being manufactured in accordance with an embodiment of the present invention.

FIG. 22 illustrates a step of the third exemplary method of forming a low-stress patterned SOI layer in which oxide is deposited into the trenches of the substrate being manufactured in accordance with an embodiment of the present invention. With reference to FIG. 22, CVD or another suitable technique may be employed to deposit oxide 2200 (e.g., using a TEOS precursor, or using HDP, etc.) onto the substrate 1802. In this manner, oxide 2200 may be deposited into the trenches (1900 in FIG. 21) formed in the substrate 1802, above the trenches and/or atop the nitride pad regions 1818-1822. CMP or another suitable process may be performed to planarize and polish the deposited oxide 2200 to respective top surfaces of the nitride pad regions 1818-1822.

In this manner, the substrate 1802 is prepared for normal processing (e.g., for chip fabrication). Therefore, electronic devices, such as complementary metal-oxide-semiconductor field-effect-transistors (CMOS) or the like, may be formed on the substrate 1802. More specifically, the third exemplary method results in SOI regions 2201 including one or more regions of silicon 2202 (e.g., top portions 2004 of the substrate 1802) formed on a layer of buried oxide 2204 that serves as an insulator. Therefore, one or more electronic devices (e.g., high-performance devices, such as devices with high switching speeds), may be formed in the one or more regions of silicon 2202.

Through use of the third exemplary method, a substrate 1805 including a thin high-quality layer of silicon on insulator may result from implanting oxygen into a bulk substrate using low energy. More specifically, oxygen may be implanted into the bulk substrate using low energy to form an SOI region including a thin silicon layer. Annealing may be employed to heal damage caused to the thin silicon layer while implanting oxygen, and to completely form the first selected implant regions into a buried oxide layer underlying the thin silicon layer. Stress to silicon regions overlying forming buried oxide layers may be reduced and/or eliminated. More specifically, STI regions may be patterned and etched prior to oxygen implantation to avoid stress due to volume expansion of the first selected implant region 2000 during high-temperature annealing. In this manner, a high-quality SOI layer of a desired thickness may be formed. The second selected implant regions (2002 in FIG. 21) which forms a buried oxide region 2206 after annealing may be a byproduct of the third exemplary method, and may identify a semiconductor device manufactured using the method.

The foregoing description discloses only exemplary embodiments of the invention. Modifications of the above disclosed apparatus and methods which fall within the scope of the invention will be readily apparent to those of ordinary skill in the art. For instance, in some embodiments rather than employing the pad nitride regions 1818-1822, the energy employed during the third exemplary method may be adjusted accordingly to achieve the result of the pad nitride regions 1818-1822.

Further, the present invention may reduce and/or eliminate the need for implanting oxygen using high energy, thereby reducing and/or minimizing damage to a bulk substrate (e.g., original single crystal silicon in the bulk substrate). Because the present invention implants oxygen using low energy, the present invention may be practical for inline wafer processing. More specifically, the low-energy implanting employed by the present invention enables the present invention to use relatively inexpensive implanters, and therefore, the present invention may be integrated in an inline process flow. Therefore, an SOI implant mask layout, SOI region thickness and/or buried oxide (BOX) region thickness may be customized as required by a specific product. For example, an SOI implant mask may be tailored to selectively produce SOI and bulk substrate regions on a substrate being manufactured. Consequently, wafers with a blanket SOI layer may not be required. Additionally, because the present invention forms a thin SOI seed layer, an oxygen implant dose required by the present method may be reduced compared to conventional methods, and therefore, stress in regions of the substrate being manufactured adjacent regions to which oxygen is implanted may be reduced. Further, the low straggle exhibited by a low-energy oxygen implant may enable scaling of a BOX thickness as desired.

Accordingly, while the present invention has been disclosed in connection with exemplary embodiments thereof, it should be understood that other embodiments may fall within the spirit and scope of the invention, as defined by the following claims.

The invention claimed is:

1. A method of forming a silicon-on-insulator (SOI) layer comprising:
   providing a silicon substrate;
   before implanting the silicon substrate with oxygen,
      forming patterned oxide regions on the silicon substrate;
      growing a first epitaxial layer of silicon on an exposed top surface of the silicon substrate; and
      forming nitride spacers on exposed sidewalls of the patterned oxide regions,
   selectively implanting the silicon substrate with oxygen using a low implant energy to form an ultra-thin patterned seed layer;
   annealing the first epitaxial layer and silicon substrate implanted with oxygen to form the ultra-thin patterned seed layer; and
   employing the ultra-thin patterned seed layer to form a patterned SOI layer on the silicon substrate,
   wherein employing the ultra-thin patterned seed layer to form a patterned SOI layer on the silicon substrate includes growing a second epitaxial layer of silicon on the ultra-thin patterned SOI seed layer.

2. The method of claim 1 wherein implanting the silicon substrate with oxygen using the low implant energy comprises implanting the silicon substrate with oxygen using an implant energy of less than about 100 KeV.

3. The method of claim 1 wherein implanting the silicon substrate with oxygen using the low implant energy comprises implanting the silicon substrate with oxygen using an implant energy of between about 20 and 100 KeV.

4. The method of claim 3 wherein implanting the silicon substrate with oxygen using the low implant energy comprises implanting the silicon substrate with oxygen using an implant energy of between about 35 and 70 KeV.

5. The method of claim 1 wherein implanting the silicon substrate with oxygen using the low implant energy comprises implanting the silicon substrate with oxygen using an implant energy of about 35 KeV or less.

6. The method of claim 5 wherein implanting the silicon substrate with oxygen using the low implant energy comprises implanting the silicon substrate with oxygen using an implant energy of about 25 KeV or less.

7. The method of claim 6 wherein implanting the silicon substrate with oxygen using the low implant energy comprises implanting the silicon substrate with oxygen using an implant energy of about 20 KeV or less.

8. The method of claim 1 wherein implanting the silicon substrate with oxygen using the low implant energy to form an ultra-thin patterned seed layer comprises implanting the silicon substrate with oxygen using the low implant energy to form a patterned SOI seed layer having a thickness of about 50 nanometers or less.

9. The method of claim 8 wherein implanting the silicon substrate with oxygen using the low implant energy to form an ultra-thin patterned seed layer comprises implanting the silicon substrate with oxygen using the low implant energy to form a patterned SOI seed layer having a thickness of about 30 nanometers or less.

10. The method of claim 1 wherein implanting the silicon substrate with oxygen using the low implant energy to form an ultra-thin patterned seed layer comprises implanting the silicon substrate with oxygen using the low implant energy to form a patterned SOI seed layer having a thickness of between about 20 and 100 nanometers.

11. The method of claim 1 wherein implanting the silicon substrate with oxygen using the low implant energy to form an ultra-thin patterned seed layer comprises implanting the silicon substrate with oxygen using the low implant energy to form a patterned SOI seed layer having a thickness of about 20 nanometers or less.

12. The method of claim 1 further comprising, after implanting the silicon substrate with oxygen, forming a buried oxide layer having a thickness of about 70 nanometers or less.

* * * * *